(12) United States Patent
Bennett

(10) Patent No.: US 8,421,663 B1
(45) Date of Patent: Apr. 16, 2013

(54) ANALOG-TO-DIGITAL CONVERTER COMPRISING DUAL OSCILLATORS FOR LINEARITY COMPENSATION

(75) Inventor: George J. Bennett, Murrieta, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 145 days.

(21) Appl. No.: 13/027,557

(22) Filed: Feb. 15, 2011

(51) Int. Cl.
*H03M 1/12* (2006.01)

(52) U.S. Cl.
USPC .......................................... 341/155; 341/157

(58) Field of Classification Search .................. 341/143, 341/144, 118, 155, 157
See application file for complete search history.

(56) References Cited

U.S. PATENT DOCUMENTS

| | | | |
|---|---|---|---|
| 5,321,402 A * | 6/1994 | Matsuzawa et al. | 341/161 |
| 6,346,907 B1 | 2/2002 | Dacy et al. | |
| 6,452,520 B1 | 9/2002 | Smith et al. | |
| 6,484,577 B1 | 11/2002 | Bennett | |
| 6,753,798 B2 * | 6/2004 | Feldtkeller | 341/143 |
| 6,850,383 B1 | 2/2005 | Bennett | |
| 6,850,384 B1 | 2/2005 | Bennett | |
| 7,315,270 B2 | 1/2008 | Maksimovic et al. | |
| 7,365,932 B1 | 4/2008 | Bennett | |
| 7,619,844 B1 | 11/2009 | Bennett | |
| 2008/0204083 A1 | 8/2008 | Kunc et al. | |
| 2008/0284627 A1 | 11/2008 | Feng et al. | |
| 2009/0153196 A1 | 6/2009 | Gebara et al. | |
| 2009/0303091 A1 | 12/2009 | Rivior | |
| 2010/0201553 A1 | 8/2010 | Huang | |
| 2012/0031202 A1 * | 2/2012 | Goto et al. | 73/862.193 |

OTHER PUBLICATIONS

Kim, Jaewook and Cho, Seonghwan, "A time-based analog-to-digital converter using a multi-phase voltage controlled oscillator," 2006 IEEE International Symposium on Circuits and Systems, 2006, Proceedings of ISCAS 2006, pp. 3934-3937.

* cited by examiner

*Primary Examiner* — Brian Young

(57) ABSTRACT

An analog-to-digital converter (ADC) is disclosed operable to convert a sensor signal to a digital value. A differential amplifier responsive to the sensor signal and a reference signal generates a first analog signal representing a first offset above the reference signal and a second analog signal representing a second offset below the reference signal. A first oscillator generates a first output frequency dependent on the first analog signal, and a second oscillator generates a second output frequency dependent on the second analog signal. A difference between the first output frequency and the second output frequency is generated, and the digital value representing the sensor signal is generated in response to the difference.

18 Claims, 3 Drawing Sheets

ANALOG-TO-DIGITAL CONVERTER COMPRISING DUAL OSCILLATORS FOR LINEARITY COMPENSATION

BACKGROUND

Analog-to-digital converters (ADC) have been implemented using a voltage controlled oscillator (VCO) wherein an input voltage is converted to an output frequency. The output frequency may then be converted to a digital value by driving a counter over a sampling interval. The counter output may then represent an average of the input voltage over the sampling interval. The accuracy of this type of ADC is affected by the center frequency (gain) of the VCO which may drift over changing environmental conditions (e.g., temperature), non-linearity of the VCO transfer function, and quantization error of the digital counter.

DETAILED DESCRIPTION OF EMBODIMENTS OF THE INVENTION

Figure 1A:
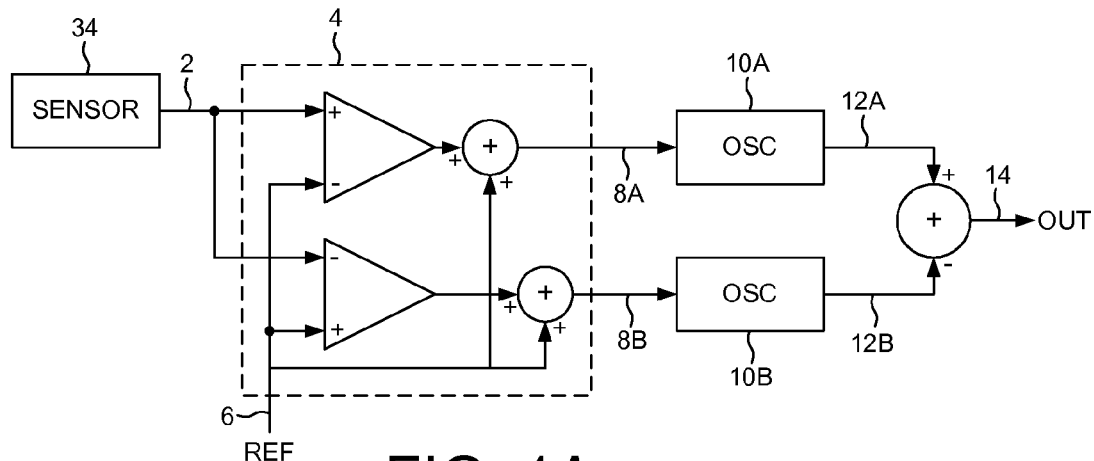
FIG. 1A shows an analog-to-digital converter (ADC) according to an embodiment of the present invention comprising first and second oscillators responsive to respective positive offset and negative offset analog signals relative to a reference signal.
Figure 1B:
FIG. 1B shows the positive offset and negative offset analog signals relative to a reference signal according to an embodiment of the present invention.

FIG. 1A shows an analog-to-digital converter (ADC) operable to convert a sensor signal 2 to a digital value. A differential amplifier 4 responsive to the sensor signal 2 and a reference signal 6 generates a first analog signal (8A or 8B) representing a first offset above the reference signal 6 and a second analog signal (8A or 8B) representing a second offset below the reference signal 6 (FIG. 1B). A first oscillator 10A generates a first output frequency 12A dependent on the first analog signal 8A, and a second oscillator 10B generates a second output frequency 12B dependent on the second analog signal 8B. A difference 14 between the first output frequency 12A and the second output frequency 12B is generated, and the digital value representing the sensor signal is generated in response to the difference 14.

Figure 1C:
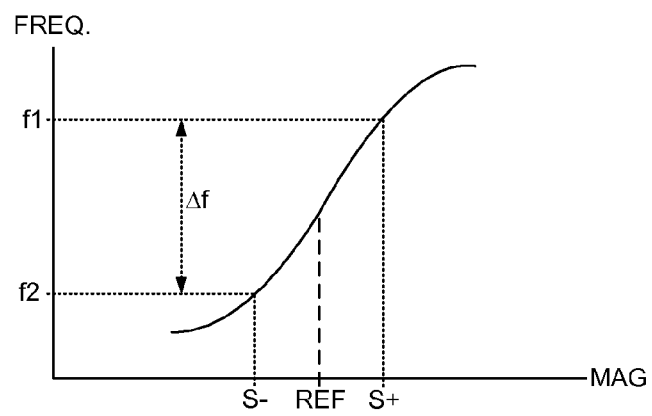
FIG. 1C illustrates a non-linear response of each oscillator.

FIG. 1C illustrates a non-linear response that each oscillator 10A and 10B may exhibit, including a non-linear response about a center operating point (represented by the reference signal 6). As the sensor signal 2 exceeds the reference signal 6, a digital value is generated in response to a difference Δf between the output frequencies f1 and f2 of the oscillators. Similarly, as the sensor signal 2 falls below the reference signal 6, a digital value is generated in response to a difference Δf between the output frequencies f1 and f2 of the oscillators. Accordingly, the difference Δf between the output frequencies f1 and f2 will be the same for a sensor signal that is above the reference frequency by an offset and below the reference frequency by the same offset, thereby compensating for non-linearity in the curve shown in FIG. 1C.

Figure 2A:
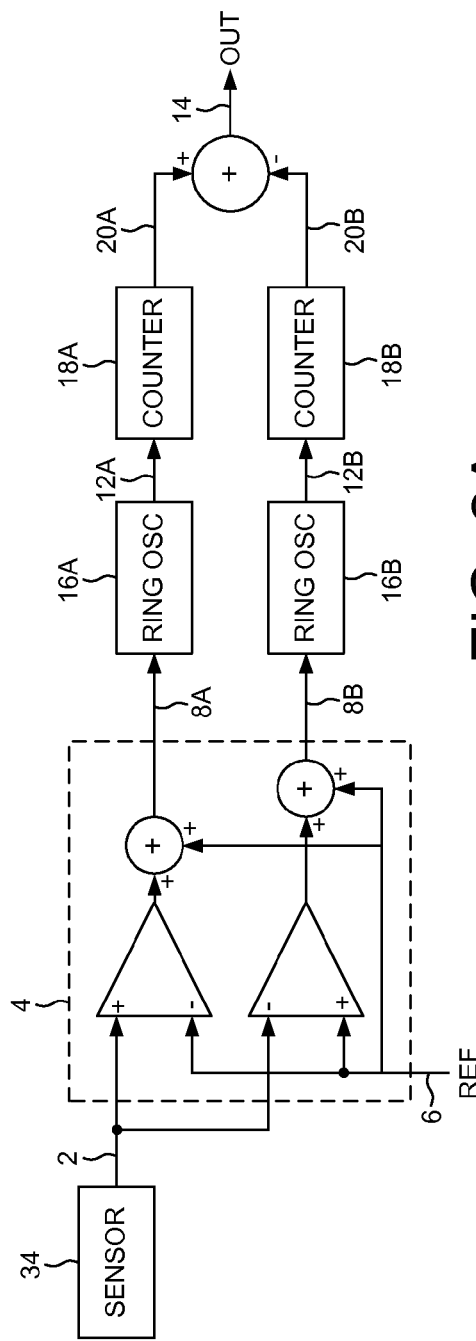
FIG. 2A shows an embodiment of the present invention wherein each oscillator drives a respective counter.

FIG. 2A shows an embodiment of the present invention wherein the first oscillator comprises a ring oscillator 16A and the second oscillator comprises a ring oscillator 16B. In one embodiment, the ring oscillators 16A and 16B are fabricated so as to substantially match one another so they have essentially the same response such as shown in FIG. 1C. The output frequency 12A of the first ring oscillator 16A drives a first counter 18A, and the output frequency 12B of the second ring oscillator 16B drives a second counter 18B, wherein the outputs 20A and 20B of the counters are subtracted to generate the difference 14 between the output frequencies. In one embodiment, the counters 18A and 18B may be reset at the beginning of a sample interval, and then the outputs evaluated at the end of the sample interval.

Figure 2B:
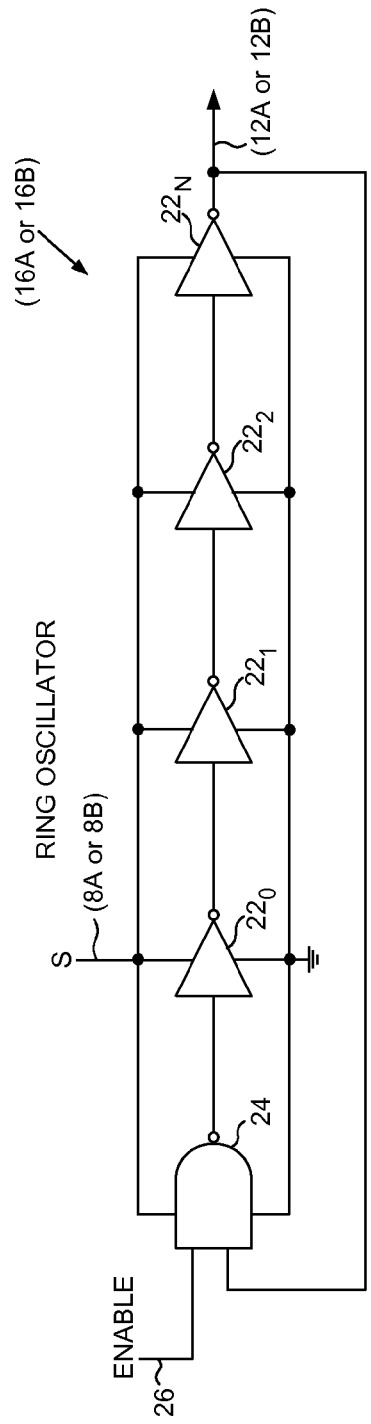
FIG. 2B shows an embodiment of the present invention wherein each oscillator comprises a ring oscillator.

FIG. 2B shows an embodiment of a ring oscillator 16A or 16B comprising a plurality of inverter elements $22_0$-$22_N$ connected in series, wherein the output of the last inverting element $22_N$ is fed back to the input of the first inverting element $22_0$ through a NAND gate 24 which is used to enable the ring oscillator in response to an enable signal 26. In one embodiment, there is an odd number of inversions in the ring oscillator which ensures the ring oscillator will oscillate. The analog voltage 8A or 8B operates as a supply voltage to the inverter elements $22_0$-$22_N$ and NAND gate 24, such that the output frequency of the ring oscillator depends on the amplitude of the analog voltage 8A or 8B which determines the propagation delay of each element. That is, as the amplitude of the analog voltage 8A or 8B increases, the propagation delay of the elements will decrease thereby causing an increase in the output frequency, and vise versa. In one embodiment, the ring oscillators 16A and 16B are enabled synchronously by the enable signal 26 after resetting the counters 18A and 18B at the beginning of a sample interval.

Figure 3:
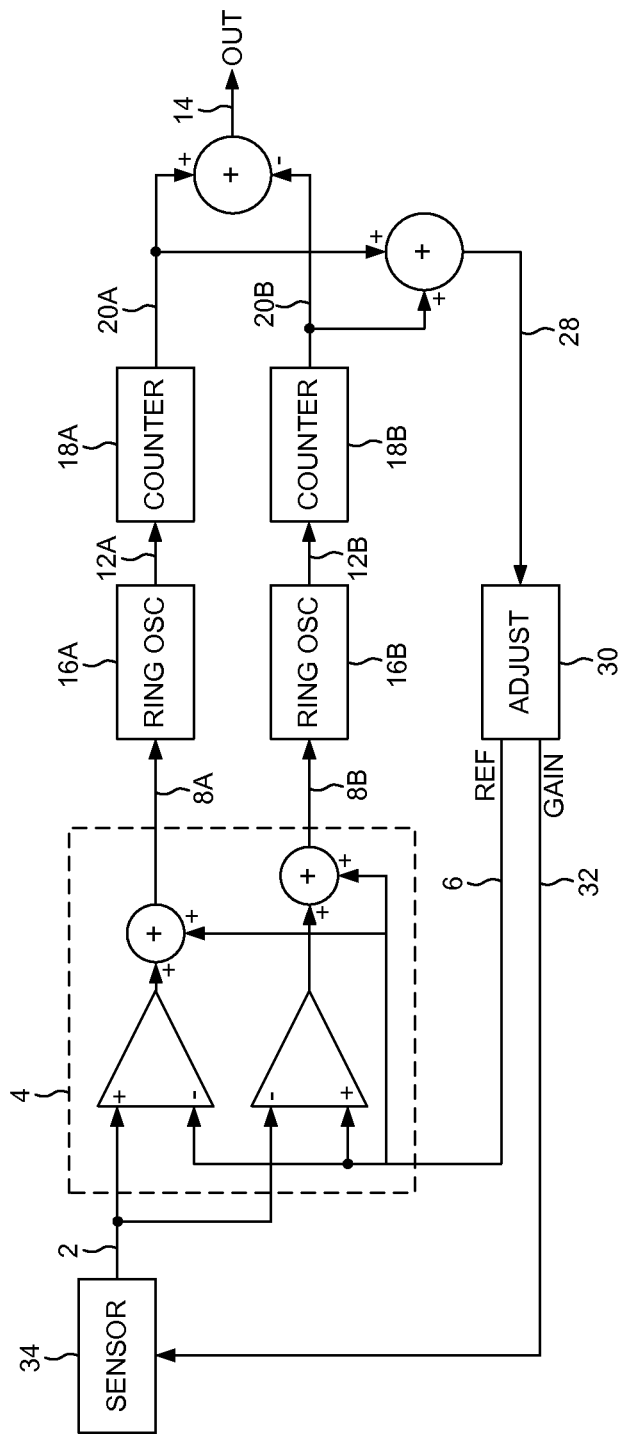
FIG. 3 shows an embodiment of the present invention wherein at least one of the reference signal and the sensor are adjusted in response to a sum of the counter outputs.

FIG. 3 shows an embodiment of the present invention wherein the outputs 20A and 20B are summed, and the sum 28 processed by control circuitry 30 in order to adjust at least one of the reference signal 6 and a control signal 32 applied to the sensor 34. In one embodiment, the control circuitry 30 adjusts the reference signal 6 so that it remains substantially centered about the response curve of the oscillators (e.g., as shown in FIG. 1C). That is, the reference signal 6 may be adjusted until the sum 28 substantially matches a target value. In another embodiment, the control circuitry 30 adjusts the control signal 32 in order to adjust a gain of the sensor 34 (e.g., by adjusting a gain of an op-amp). For example, during a calibration phase the sensor 34 may be excited with a known signal and the gain adjusted until the sum 28 substantially matches a target value corresponding to the known signal.

Any suitable sensor 34 may be employed in the embodiments of the present invention, such as an optical sensor, piezoelectric sensor, electromagnetic sensor, temperature sensor, pressure sensor, vibration sensor, etc. In one embodiment, the sensor 34 may be employed in a storage device, such as a disk drive that may utilize one or more of the aforementioned sensors.

What is claimed is:

1. An analog-to-digital converter (ADC) operable to convert a sensor signal to a digital value, the ADC comprising:
 a differential amplifier responsive to the sensor signal and a reference signal, the differential amplifier operable to generate a first analog signal representing a first offset above the reference signal and a second analog signal representing a second offset below the reference signal;
 a first oscillator comprising a first output frequency dependent on the first analog signal;

a second oscillator comprising a second output frequency dependent on the second analog signal; and control circuitry operable to:

generate a difference between the first output frequency and the second output frequency; and generate the digital value representing the sensor signal in response to the difference.

2. The ADC as recited in claim 1, wherein the first oscillator comprises a first ring oscillator and the second oscillator comprises a second ring oscillator.

3. The ADC as recited in claim 2, wherein the first ring oscillator is substantially matched to the second ring oscillator.

4. The ADC as recited in claim 1, wherein the difference between the first output frequency and the second output frequency compensates for a non-linearity of the first and second oscillators.

5. The ADC as recited in claim 1, wherein the control circuitry comprises:

a first counter driven by the first output frequency; and a second counter driven by the second output frequency, wherein the difference is generated in response to a difference between the first and second counters.

6. The ADC as recited in claim 1, wherein the control circuitry is further operable to adjust the reference signal in response to the first and second output frequencies.

7. The ADC as recited in claim 6, wherein the control circuitry is further operable to adjust the reference signal in response to a sum of the first and second output frequencies.

8. The ADC as recited in claim 7, wherein the control circuitry comprises:

a first counter driven by the first output frequency; and a second counter driven by the second output frequency, wherein the sum is generated in response to a sum of the first and second counters.

9. The ADC as recited in claim 8, wherein the control circuitry is further operable to adjust a sensor for generating the sensor signal in response to the sum.

10. A method of converting a sensor signal to a digital value, the method comprising:

generating a first analog signal representing a first offset above a reference signal and a second analog signal representing a second offset below the reference signal;

using a first oscillator to generate a first output frequency dependent on the first analog signal;

using a second oscillator to generate a second output frequency dependent on the second analog signal;

generating a difference between the first output frequency and the second output frequency; and generating the digital value representing the sensor signal in response to the difference.

11. The method as recited in claim 10, wherein the first oscillator comprises a first ring oscillator and the second oscillator comprises a second ring oscillator.

12. The method as recited in claim 11, wherein the first ring oscillator is substantially matched to the second ring oscillator.

13. The method as recited in claim 10, wherein the difference between the first output frequency and the second output frequency compensates for a non-linearity of the first and second oscillators.

14. The method as recited in claim 10, further comprising:

driving a first counter with the first output frequency;

driving a second counter with the second output frequency; and generating the difference in response to a difference between the first and second counters.

15. The method as recited in claim 10, further comprising adjusting the reference signal in response to the first and second output frequencies.

16. The method as recited in claim 15, further comprising adjusting the reference signal in response to a sum of the first and second output frequencies.

17. The method as recited in claim 16, further comprising:

driving a first counter with the first output frequency;

driving a second counter with the second output frequency; and generating the sum in response to a sum of the first and second counters.

18. The method as recited in claim 17, further comprising adjusting a sensor for generating the sensor signal in response to the sum.

* * * * *